United States Patent
Moon et al.

(10) Patent No.: US 10,109,545 B2
(45) Date of Patent: Oct. 23, 2018

(54) SEMICONDUCTOR DEVICES HAVING THROUGH ELECTRODES AND METHODS OF MANUFACTURING THE SAME

(71) Applicant: SK hynix Inc., Icheon (KR)

(72) Inventors: Jong Kyu Moon, Icheon (KR); Jong Hoon Kim, Suwon (KR); Sung Su Park, Yongin (KR)

(73) Assignee: SK HYNIX INC., Icheon (KR)

( * ) Notice: Subject to any disclaimer, the term of this patent is extended or adjusted under 35 U.S.C. 154(b) by 27 days.

(21) Appl. No.: 15/459,592

(22) Filed: Mar. 15, 2017

(65) Prior Publication Data

US 2017/0186659 A1 Jun. 29, 2017

Related U.S. Application Data

(62) Division of application No. 14/466,908, filed on Aug. 22, 2014, now abandoned.

(30) Foreign Application Priority Data

Mar. 19, 2014 (KR) .......................... 10-2014-0032358

(51) Int. Cl.
*H01L 23/26* (2006.01)
*H01L 21/304* (2006.01)
(Continued)

(52) U.S. Cl.
CPC ............ *H01L 23/26* (2013.01); *H01L 21/304* (2013.01); *H01L 21/30604* (2013.01); *H01L 21/6835* (2013.01); *H01L 21/76898* (2013.01); *H01L 23/3114* (2013.01); *H01L 23/3192* (2013.01); *H01L 23/481* (2013.01); *H01L 24/05* (2013.01); *H01L 24/13* (2013.01); *H01L 24/14* (2013.01);
(Continued)

(58) Field of Classification Search
CPC ......... H01L 23/481; H01L 2224/13018; H01L 2224/13025; H01L 2225/06541; H01L 21/76898
See application file for complete search history.

(56) References Cited

U.S. PATENT DOCUMENTS 7,998,860 B2  8/2011 Li et al.
8,026,592 B2  9/2011 Yoon et al.
(Continued)

FOREIGN PATENT DOCUMENTS

CN  101044609 A  *  9/2007
KR  10-2012-0120776 A  11/2012
KR  10-2013-0062737 A  6/2013

*Primary Examiner* — David Spalla

(57) ABSTRACT

Semiconductor devices are provided. The semiconductor device includes a semiconductor layer having a first surface and a second surface that are opposite each other, a through electrode penetrating the semiconductor layer and having a protrusion that protrudes over the second surface of the semiconductor layer, a front-side bump disposed over the first surface of the semiconductor layer and electrically coupled to the through electrode, a polymer pattern disposed over the second surface of the semiconductor layer to enclose a part of the protrusion of the through electrode, and a back-side bump covering an upper surface and a sidewall of a remaining part of the protrusion of the through electrode and extending over a portion of the polymer pattern.

15 Claims, 14 Drawing Sheets

(51) Int. Cl.
  *H01L 21/306* (2006.01)
  *H01L 23/00* (2006.01)
  *H01L 21/768* (2006.01)
  *H01L 23/31* (2006.01)
  *H01L 23/48* (2006.01)
  *H01L 21/683* (2006.01)

(52) U.S. Cl.
  CPC ............... *H01L 24/03* (2013.01); *H01L 24/11* (2013.01); *H01L 2221/6834* (2013.01); *H01L 2221/68327* (2013.01); *H01L 2224/03002* (2013.01); *H01L 2224/0345* (2013.01); *H01L 2224/0361* (2013.01); *H01L 2224/03452* (2013.01); *H01L 2224/03912* (2013.01); *H01L 2224/0401* (2013.01); *H01L 2224/05008* (2013.01); *H01L 2224/05025* (2013.01); *H01L 2224/0557* (2013.01); *H01L 2224/05147* (2013.01); *H01L 2224/05166* (2013.01); *H01L 2224/05184* (2013.01); *H01L 2224/05558* (2013.01); *H01L 2224/05562* (2013.01); *H01L 2224/05568* (2013.01); *H01L 2224/05647* (2013.01); *H01L 2224/11002* (2013.01); *H01L 2224/1147* (2013.01); *H01L 2224/11462* (2013.01); *H01L 2224/131* (2013.01); *H01L 2224/13012* (2013.01); *H01L 2224/13014* (2013.01); *H01L 2224/13016* (2013.01); *H01L 2224/13017* (2013.01); *H01L 2224/13018* (2013.01); *H01L 2224/13025* (2013.01); *H01L 2224/13083* (2013.01); *H01L 2224/13111* (2013.01); *H01L 2224/13144* (2013.01); *H01L 2224/13147* (2013.01); *H01L 2224/13155* (2013.01); *H01L 2224/14181* (2013.01); *H01L 2924/01029* (2013.01)

(56) References Cited

U.S. PATENT DOCUMENTS 8,299,612 B2    10/2012    West et al.
2010/0038800 A1*   2/2010    Yoon et al.

* cited by examiner

SEMICONDUCTOR DEVICES HAVING THROUGH ELECTRODES AND METHODS OF MANUFACTURING THE SAME

CROSS-REFERENCE TO RELATED APPLICATION

The present application is a divisional of U.S. application Ser. No. 14/466,908, filed on Aug. 22, 2014, which claims priority under 35 U.S.C 119(a) to Korean Patent Application No. 10-2014-0032358, filed on Mar. 19, 2014, in the Korean Intellectual Property Office, which are incorporated herein by reference in their entirety as set forth in full.

BACKGROUND

1. Technical Field

Embodiments of the present disclosure relate to semiconductor devices having through electrodes and methods of manufacturing the same.

2. Related Art

Ultra small-sized semiconductor devices with a large storage capacity are increasingly in demand with the development of smaller, high performance electronic products. A plurality of semiconductor chips may be assembled in a single semiconductor package to increase a data storage capacity of a semiconductor device. That is, the data storage capacity of the semiconductor device may be readily increased using a multi-chip packaging technique.

However, even though a multi-chip packaging technique may increase the data storage capacity of a semiconductor device, it may be difficult to obtain sufficient space for electrical connections between a plurality of semiconductor chips in the multi-chip package as the number of the semiconductor chips increases. Recently, through silicon vias (TSVs) have been proposed to resolve limitations of the multi-chip packaging technique. TSVs may be formed to penetrate a plurality of chips at a wafer level, and the chips stacked in a package may be electrically and physically connected to each other by the TSVs. Accordingly, if TSVs are employed in packages, the performance and the storage capacity of the packages may be improved.

SUMMARY

Various embodiments of the present disclosure are directed to semiconductor devices having through electrodes and methods of manufacturing the same.

According to some embodiments, a semiconductor device includes a semiconductor layer having a first surface and a second surface that are opposite to each other, a through electrode penetrating the semiconductor layer and having a protrusion that protrudes over the second surface of the semiconductor layer, a front-side bump disposed over the first surface of the semiconductor layer and electrically coupled to the through electrode, a polymer pattern disposed over the second surface of the semiconductor layer to enclose a part of the protrusion of the through electrode, and a back-side bump covering an upper surface and a sidewall of a remaining part of the protrusion of the through electrode and extending over a portion of the polymer pattern.

According to further embodiments, a semiconductor device includes a semiconductor layer having a first surface and a second surface that are opposite to each other, a through electrode penetrating the semiconductor layer from the first surface of the semiconductor layer toward the second surface of the semiconductor layer and having a protrusion that protrudes from the second surface of the semiconductor layer, a front side bump disposed over the first surface of the semiconductor layer and electrically coupled to the through electrode, a polymer pattern disposed over the second surface of the semiconductor layer, the polymer pattern enclosing a lower portion of the protrusion of the through electrode, and a backside bump covering an upper surface and a sidewall of an upper portion of the protrusion of the through electrode and extending over a portion of the polymer pattern.

According to further embodiments, a semiconductor device includes a semiconductor layer having a first surface and a second surface that are opposite to each other. The first surface is adjacent to an active region defined in the semiconductor layer. A through electrode penetrates the semiconductor layer and has a first end surface disposed at the same side of the semiconductor layer as the first surface of the semiconductor layer and a second end surface disposed at the same side of the semiconductor layer as the second surface of the semiconductor layer. The through electrode has a protrusion that protrudes from the second surface of the semiconductor layer. A front side bump is disposed over the first surface of the semiconductor layer and is electrically connected to the through electrode. A polymer pattern is disposed over the second surface of the semiconductor layer to enclose a sidewall of the lower portion of the protrusion of the through electrode. A backside bump covers an end portion of the protrusion of the through electrode and extends onto a portion of the polymer pattern.

According to further embodiments, a method of manufacturing a semiconductor device includes providing a wafer that has a through electrode therein and a front side bump electrically coupled to the through electrode. The front side bump is disposed over a first surface of the wafer. A second surface of the wafer opposite to the first surface is recessed to protrude one end of the through electrode from the recessed second surface of the wafer. A polymer pattern is formed over the recessed second surface of the wafer, the polymer pattern enclosing a lower portion of the protruding end of the through electrode. A backside bump is formed to cover an upper surface and a sidewall of an upper portion of the protruding end of the through electrode and to extend over the polymer pattern.

BRIEF DESCRIPTION OF THE DRAWINGS

Embodiments of the present disclosure will become more apparent in view of the attached drawings and accompanying detailed description, in which:

FIGS. 2 to 11A and 11B are cross-sectional views illustrating a method of manufacturing a semiconductor device according to an embodiment of the present disclosure.

DETAILED DESCRIPTION

Figure 1:
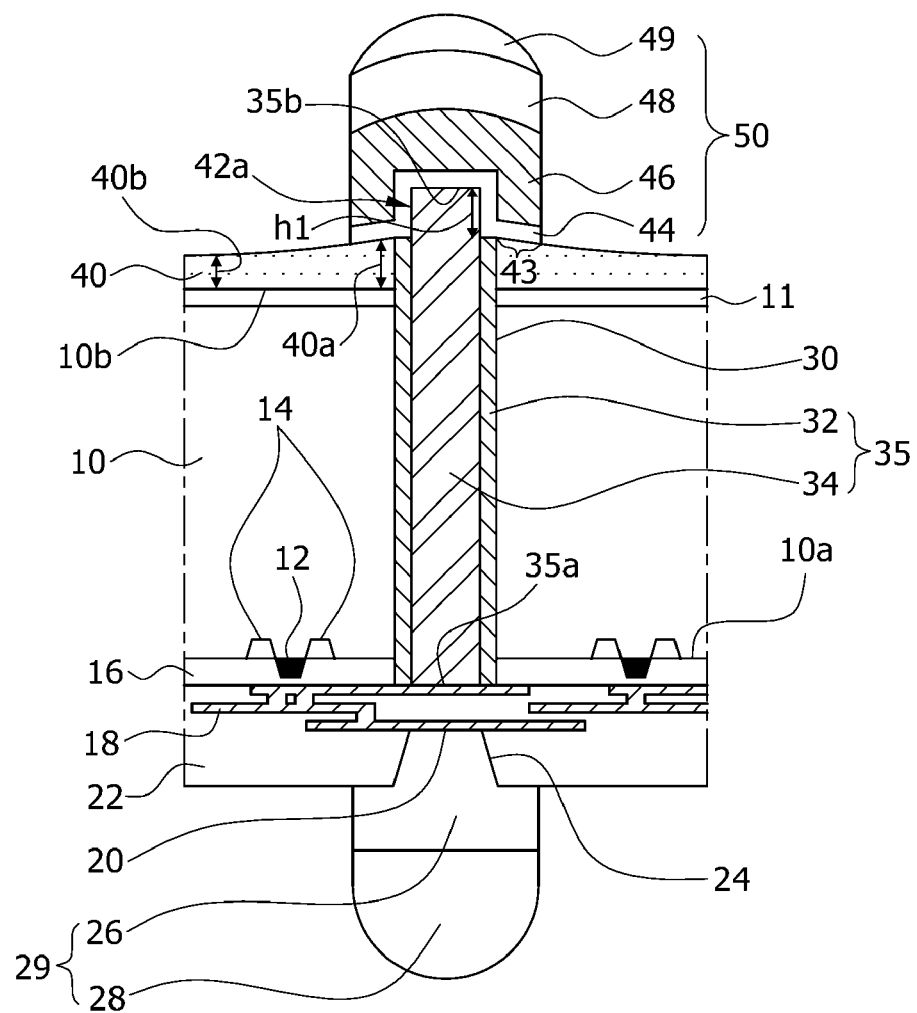
FIG. 1 is a cross-sectional view illustrating a semiconductor device according to an embodiment of the present disclosure.

FIG. 1 is a cross-sectional view illustrating a semiconductor device according to an embodiment of the present disclosure. The semiconductor device includes a semiconductor layer 10 such as a silicon layer, a through electrode 35 vertically penetrating the semiconductor layer 10, a front-side bump 29 disposed on a first surface 10a of the semiconductor layer 10 and electrically coupled to the through electrode 35, and a back-side bump 50 disposed on a second surface 10b of the semiconductor layer 10 opposite to the front-side bump 29.

The first surface 10a of the semiconductor layer 10 may correspond to a front-side surface to which active regions are adjacent, and the second surface 10b of the semiconductor layer 10 may correspond to a back-side surface. Transistors including gate electrodes 12 and source/drain regions 14 are disposed near the first surface 10a of the semiconductor layer 10. The transistors and the first surface 10a are covered with an interlayer insulation layer 16. Circuit patterns 18, through which electrical signals may be applied to the gate electrodes 12 and the source/drain regions 14 of the transistors, are disposed on and in the interlayer insulation layer 16.

A through hole 30 penetrates the semiconductor layer 10 from the first surface 10a to the second surface 10b, and the through hole 30 is filled by the through electrode 35. The through electrode 35 includes a through metal electrode 34 and a barrier layer 32 enclosing sidewalls of the through metal electrode 34. The through metal electrode 34 may include a copper material. The barrier layer 32 is disposed between the through metal electrode 34 and the semiconductor layer 10. The barrier layer 32 substantially prevents metal atoms in the through metal electrode 34 from diffusing into the semiconductor layer 10.

The through electrode 35 includes a first end surface 35a adjacent to the first surface 10a of the semiconductor layer 10 and a second end surface 35b adjacent to the second surface 10b of the semiconductor layer 10. The first end surface 35a of the through electrode 35 may be in contact with the circuit patterns 18 so that the through electrode 35 is electrically coupled to the circuit patterns 18.

The circuit pattern 18 is electrically coupled to a bonding pad 20, which is electrically coupled to a substrate of an external circuit (not shown). The bonding pad 20 is exposed by an opening 24 in an insulation layer 22 that covers the circuit patterns 18.

The front-side bump 29 is attached to the exposed portion of the bonding pad 20. The front-side bump 29 includes a metal pillar 26 filling the opening 24 and a solder bump 28 disposed on a surface of the metal pillar 26 opposite to the bonding pad 20. The metal pillar 26 may include a copper material.

The second end surface 35b of the through electrode 35 protrudes from the second surface 10b of the semiconductor layer 10 by a predetermined height. That is, with respect to the orientation of the figure, the through electrode 35 protrudes over the second surface 10b of the semiconductor layer 10.

The second end surface 35b and a part of sidewalls 42a of the protrusion of the through electrode 35 may be covered by the back-side bump 50. The back-side bump 50 includes a seed metal pattern 44, a first metal layer 46, a second metal layer 48 and an adhesive metal layer 49, which are sequentially stacked on the second surface 10b of the semiconductor layer 10 to cover the protrusion of the through electrode 35. The back-side bump 50 is in contact with the second end surface 35b and the part of sidewalls 42a of the protrusion of the through electrode 35. That is, the backside bump 50 is in contact with three surfaces of the through electrode 35.

In an embodiment, the back-side bump 50 laterally extends onto a polymer pattern 40 that covers the second surface 10b of the semiconductor layer 10. The polymer pattern 40 encloses a lower portion of the protruding through electrode 35, including the protruding through metal electrode 34 and the barrier layer 32, but does not extend beyond the barrier layer 32 to cover an upper portion of the protruding through metal electrode 34. In this embodiment, the back-side bump 50 covers the upper portion of the protruding through metal electrode 34, and the back-side bump 50 laterally extends from the sidewall of the protruding through metal electrode 34 by a first width 43. The upper portion of the protruding through metal electrode 34 may protrude from the polymer pattern 40 by a height h1. In accordance with this embodiment, a contact area of the back-side bump 50 is increased compared to a back-side bump that contacts only the second end surface 35b of the through electrode 35, i.e., an upper surface of the protruding through metal electrode 34.

In an embodiment, the first metal layer 46 of the back-side bump 50 includes a copper material. In an embodiment, the seed metal pattern 44 of the back-side bump 50 includes the same material as that of the first metal layer 46. The second metal layer 48 is disposed on the first metal layer 46 and may include a nickel material or a gold material. In other embodiments, the second metal layer 48 includes a tin material or a silver material.

The back-side bump 50 may have a semispherical shape. The first metal layer 46, the second metal layer 48 and the adhesive metal layer 49 are stacked on the protruding through electrode 35 to form the back-side bump 50 having a convex upper surface. In an embodiment, each of the first metal layer 46, the second metal layer 48, and the adhesive metal layer 49 has a convex upper surface. In some embodiments, a width of the first metal layer 46 may be less than that of the second metal layer 48, and thus the back-side bump 50 has a mushroom shape.

A thickness of the polymer pattern 40 may gradually reduce as it extends from the sidewall of the through electrode 35. Thus, the polymer pattern 40 may have a first thickness 40a at a position near the sidewall of the through electrode 35 and a second thickness 40b, which is less than the first thickness 40a, at a position far from the sidewall of the through electrode 35. Since the polymer pattern 40 encloses the lower portion of the protruding through metal electrode 34, the first thickness 40a may correspond to a height of a protruding portion of the through electrode 35, including the lower portion of the protruding through metal electrode 34 and the barrier layer 32.

Since the protruding portion of the through electrode 35 is supported by the polymer pattern 40 having the first thickness 40a, the polymer pattern 40 may prevent the protrusion of the through electrode 35 from being broken or bent during a subsequent fabrication process. Moreover, since the polymer pattern 40 directly contacts a bottom surface of the back-side bump 50, the bond of the back-side bump 50 to the through electrode 35 may be strengthened.

The polymer pattern 40 may include at least one selected from the group consisting of a benzocyclobutene (BCB) material, a polyimide material, and a phenol-type polymer material. The polymer pattern 40 does not have crack properties such as oxide or nitride. Thus, formation of cracks can be prevented in the polymer pattern 40 while the semiconductor device is manufactured or electronic products employing the semiconductor device are used.

In some embodiments, a grinding process is applied to a backside of the semiconductor layer 10, and a gettering layer 11 is formed on the ground backside of the semiconductor layer 10. The gettering layer 11 on the semiconductor layer 10 may prevent metal atoms or metal ions (e.g., copper atoms or copper ions) in the back-side bump 50 from diffusing into the semiconductor layer 10. That is, the gettering layer 11 may prevent metal contamination of the semiconductor layer 10. In this embodiment, the gettering layer 11 is disposed on the second surface 10b of the semiconductor layer 10.

FIGS. 2 to 11A and 11B are cross-sectional views illustrating a method of manufacturing a semiconductor device according to an embodiment of the present disclosure.

Figure 2:
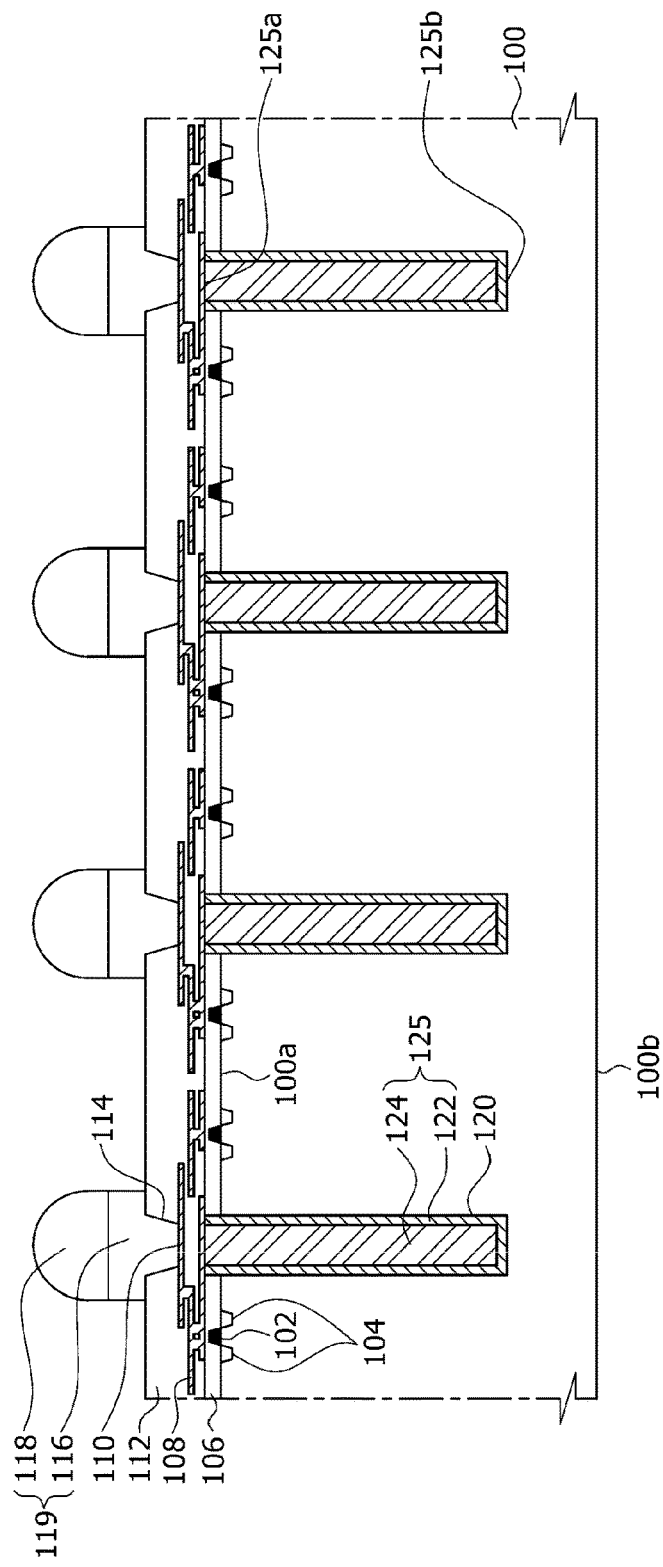

Referring to FIG. 2, a wafer 100 having through electrodes 125 and front-side bumps 119 electrically coupled to the through electrodes 125 are provided. The wafer 100 may include a silicon wafer and have a front-side surface 100a and a back-side surface 100b that are opposite each other. The wafer 100 may be a substrate that is used in fabrication of semiconductor memory devices, semiconductor logic devices, photo devices, display units, or the like. The front-side surface 100a may correspond to a surface that is adjacent to active regions in which active elements or passive elements are formed, and the back-side surface 100b may correspond to a surface that opposes the front-side surface 100a.

Transistors may be formed on and in the wafer 100 near the front-side surface 100a. Each of the transistors may include a gate electrode 102 and source/drain regions 104. An interlayer insulation layer 106 is formed on the front-side surface 100a to cover the transistors, and circuit patterns 108 such as bit lines are formed in or on the interlayer insulation layer 106. Accordingly, electrical signals may be applied to the gate electrode 102 and source/drain regions 104 via the circuit patterns 108.

The through electrodes 125, such as through silicon vias (TSVs), are formed in the wafer 100. The through electrodes 125 may be formed by patterning the wafer 100 to form trenches 120 having a predetermined depth from the front-side surface 100a and extending toward the back-side surface 100b, forming a barrier material layer on inner surfaces of the trenches 120, forming a through metal layer filling the remaining portion of the trenches 120, and planarizing the through metal layer and the barrier material layer to form barrier layers 122 and through metal electrodes 124 in respective trenches 120. The through electrodes 125 are spaced apart from each other by a predetermined distance. The through metal electrodes 124 may include a copper material, a silver material or a tin material. The barrier layer 122 may prevent metal atoms or metal ions in the through metal electrodes 124 from diffusing into the wafer 100. Each of the through electrodes 125 has a first end surface 125a at the same side of the wafer 100 as the front-side surface 100a and a second end surface 125b near the back-side surface 100b. The circuit patterns 108 may be in contact with the first end surfaces 125a of the through electrodes 125 so that the circuit patterns 108 are coupled to the through electrodes 125.

Bonding pads 110 are formed on respective ones of the through electrodes 125. The bonding pads 110 may be electrically coupled to the through electrodes 125 via the circuit patterns 108. The bonding pads 110 may be electrically coupled to a substrate of an external circuit (not shown) or the like.

An insulation layer 112 is formed on the interlayer insulation layer 106 to cover the bonding pads 110 and the circuit patterns 108. The insulation layer 112 is then patterned to form openings 114 partially exposing the bonding pads 110.

Front-side bumps 119 are formed on respective ones of the exposed portions of the bonding pads 110. Each of the front-side bumps 119 includes a metal pillar 116 and a solder bump 118 which are stacked on a corresponding one of the bonding pads 110. In an embodiment, the metal pillar 116 has a circular shape in a plan view. However, embodiments are not limited thereto. In another embodiment, the metal pillar 116 has a polygonal shape in a plan view. In an embodiment, the solder bump 118 formed on the metal pillar 116 has a semispherical shape in a cross-sectional view, as illustrated in FIG. 2.

Figure 3:
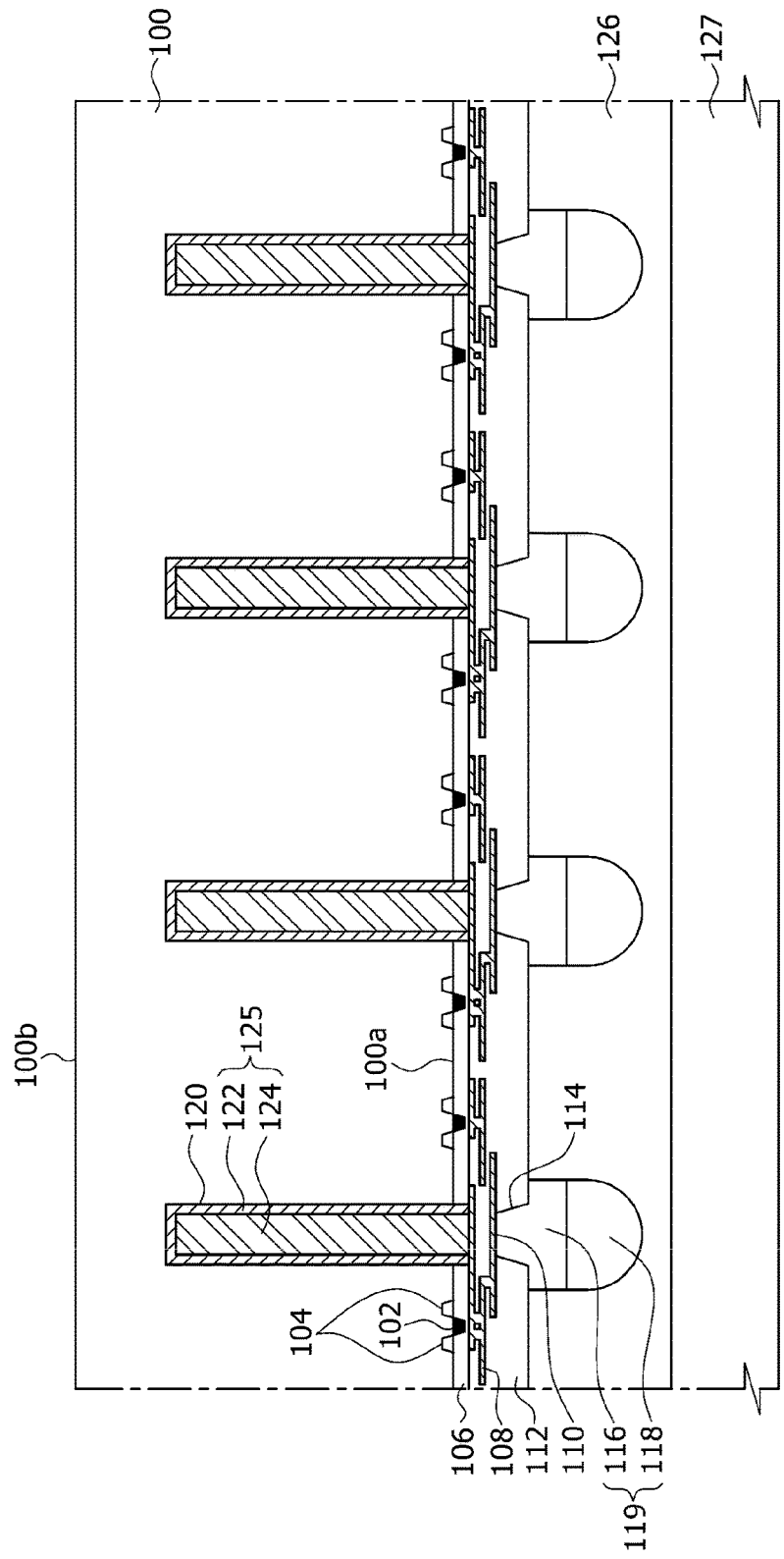

Referring to FIG. 3, a carrier substrate 127 is attached to the front-side bumps 119 disposed on the front-side surface 110a of the wafer 100. The carrier substrate 127 is attached to the front-side bumps 119 using an adhesive layer 126. The adhesive layer 126 may have a sufficient thickness to entirely cover all of the front-side bumps 119.

The processes described above are performed while the wafer 100 is oriented such that the initial back-side surface 100b is provided as the bottom surface of the wafer 100 and the front-side surface 100a is provided as the top surface of the wafer 100, as shown by the orientation of FIG. 2. After the carrier substrate 127 is attached to the front-side bumps 119 using the adhesive layer 126, the wafer 100 is turned over so that the initial back-side surface 100b of the wafer 100 is provided as the top surface of the wafer 100 and the front-side surface 100a is provided as the bottom surface of the wafer 100, as shown in FIG. 3.

Figure 4:
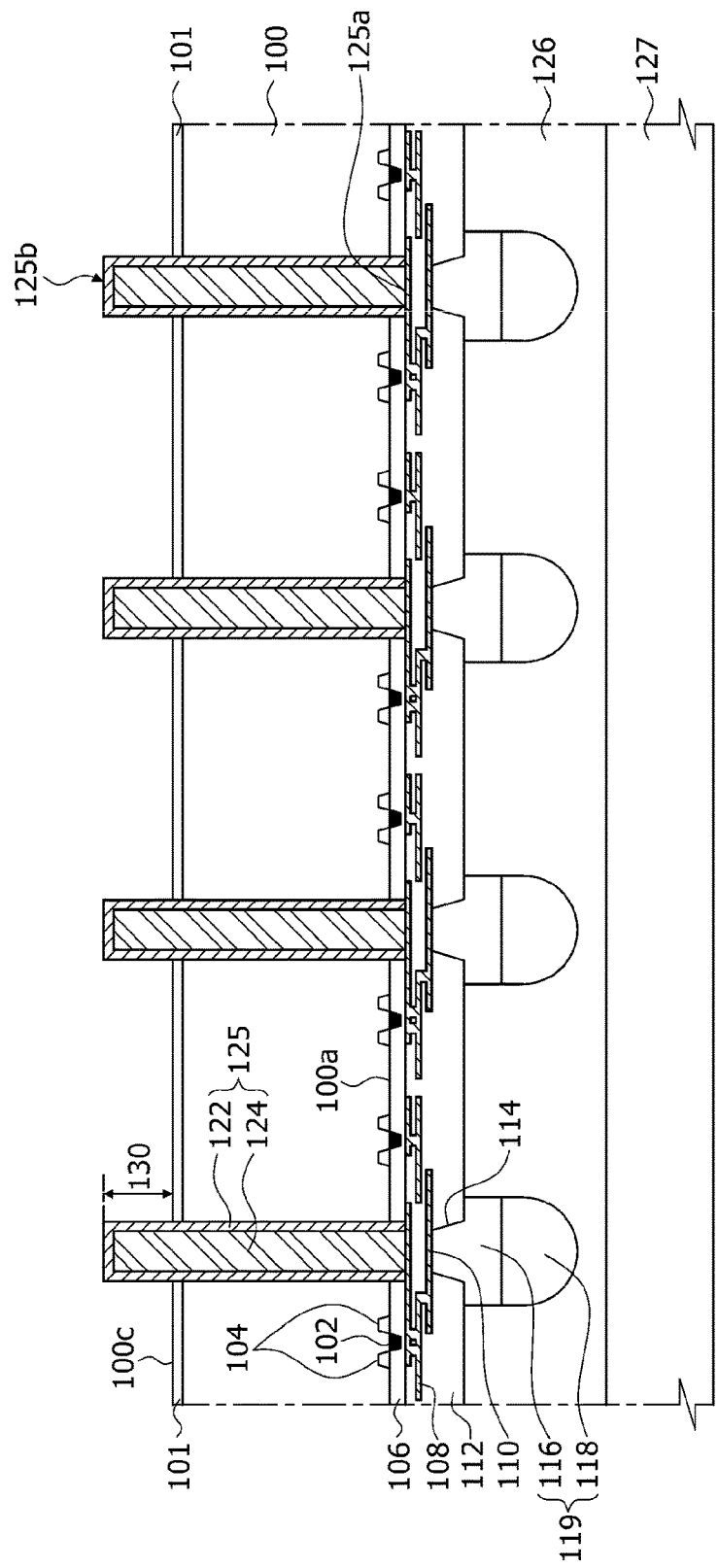

Referring to FIG. 4, an etching process is performed on the back-side surface 100b of FIG. 3 to expose the second end surface 125b of the through electrodes 125. In an embodiment, a grinding process is applied to the back-side surface 100b to remove a portion of a predetermined thickness from the back side of the wafer 100. Subsequently, the wafer 100 may be selectively etched using an etching process to form a recessed back-side surface, i.e., a surface 100c that is recessed between protruding through electrodes 125. The etching process may be performed using a dry etching process or a wet etching process. As a result of the etching process, the second end surface 125b of the through electrodes 125 protrude over the recessed back-side surface 100c of the wafer 100. Thus, each of the through electrodes 125 has a protrusion having a predetermined height 130. In some embodiments, the back-side surface 100b of the wafer 100 may be recessed using at least one selected from a grinding process, a chemical mechanical polishing (CMP) process, an isotropic etching process and an anisotropic etching process.

In some embodiments, a surface treatment process such as a grinding process is applied to the recessed back-side surface 100c of the wafer 100 after selectively etching process of wafer 100. As a result, the recessed back-side surface 100c of the wafer 100 may have a rough surface provided for a gettering layer 101.

The gettering layer 101 formed on the recessed back-side surface 100c may prevent metal atoms or metal ions (e.g., copper atoms or copper ions) in back-side bumps to be formed in a subsequent process from diffusing into the wafer 100.

Figure 5:
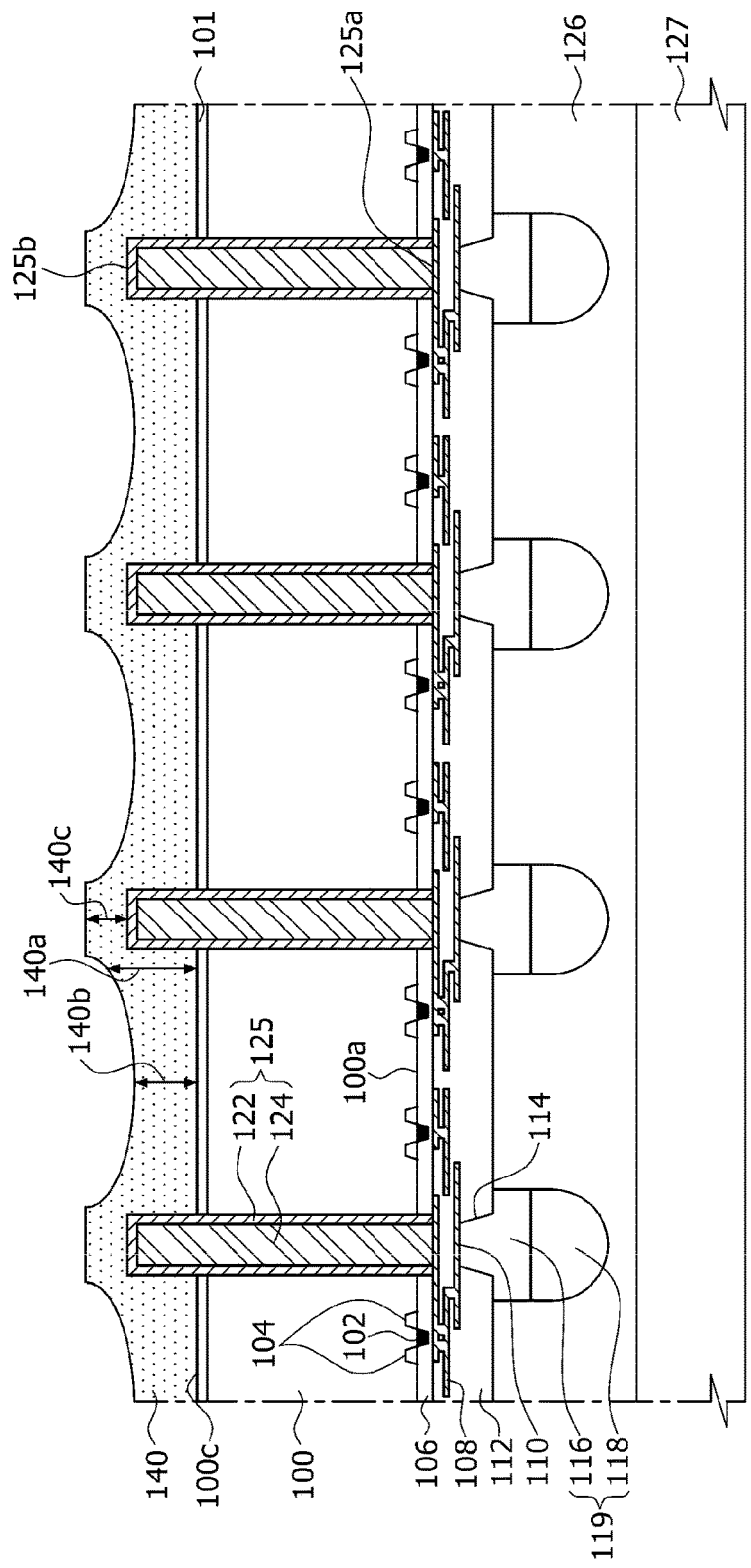

Referring to FIG. 5, a polymer layer 140 is formed on the recessed back-side surface 100c of the wafer 100. The polymer layer 140 is formed to have a sufficient thickness to cover the protrusions of the through electrodes 125. The polymer layer 140 may be formed by coating the recessed back-side surface 100c with a polymer material in a gel state with a spin-coating process. The polymer layer 140 may have an uneven surface profile, as illustrated in FIG. 5.

The polymer layer 140 may be formed of an insulation polymer material to which a curing process can be applied at a low temperature below about 200 degrees Celsius. In some embodiments, the polymer layer 140 may be formed to include at least one selected from the group consisting of a benzocyclobutene (BCB) material, a polyimide material and a phenol-type polymer material. The polymer layer 140 does not have crack properties such as oxide or nitride. Thus, no cracks are generated in the polymer layer 140 even while subsequent processes are performed thereon.

As described above, because the second end surface 125b of the through electrodes 125 protrude from the recessed back-side surface 100c of the semiconductor layer 100, the polymer layer 140 may have an uneven surface profile. That is, a thickness of the polymer layer 140 may vary depending on a position of the polymer layer 140.

Since the polymer layer 140 is formed using a polymer material in a gel state with a spin-coating process, as described above, the polymer layer 140 coated on top surfaces of the protrusions of the through electrodes 125 may quickly spread out laterally from the through electrodes 125 and pile up in regions adjacent to sidewalls of the protrusions of the through electrodes 125 during the spin-coating process. Thus, the polymer layer 140 adjacent to the sidewalls of the protrusions of the through electrodes 125 may have a first thickness 140a, and a thickness of the polymer layer 140 may be gradually reduced as it extends further from the sidewalls of the protrusions of the through electrodes 125.

Accordingly, after the spin-coating process, the polymer layer 140 located in central portions between the protrusions of the through electrodes 125 may have a second thickness 140b which is smaller than the first thickness 140a, and the polymer layer 140 coated on the second end surfaces 125b, i.e., the top surfaces of the protrusions, of the through electrodes 125 may have a third thickness 140c which is smaller than the second thickness 140b.

Figure 6:
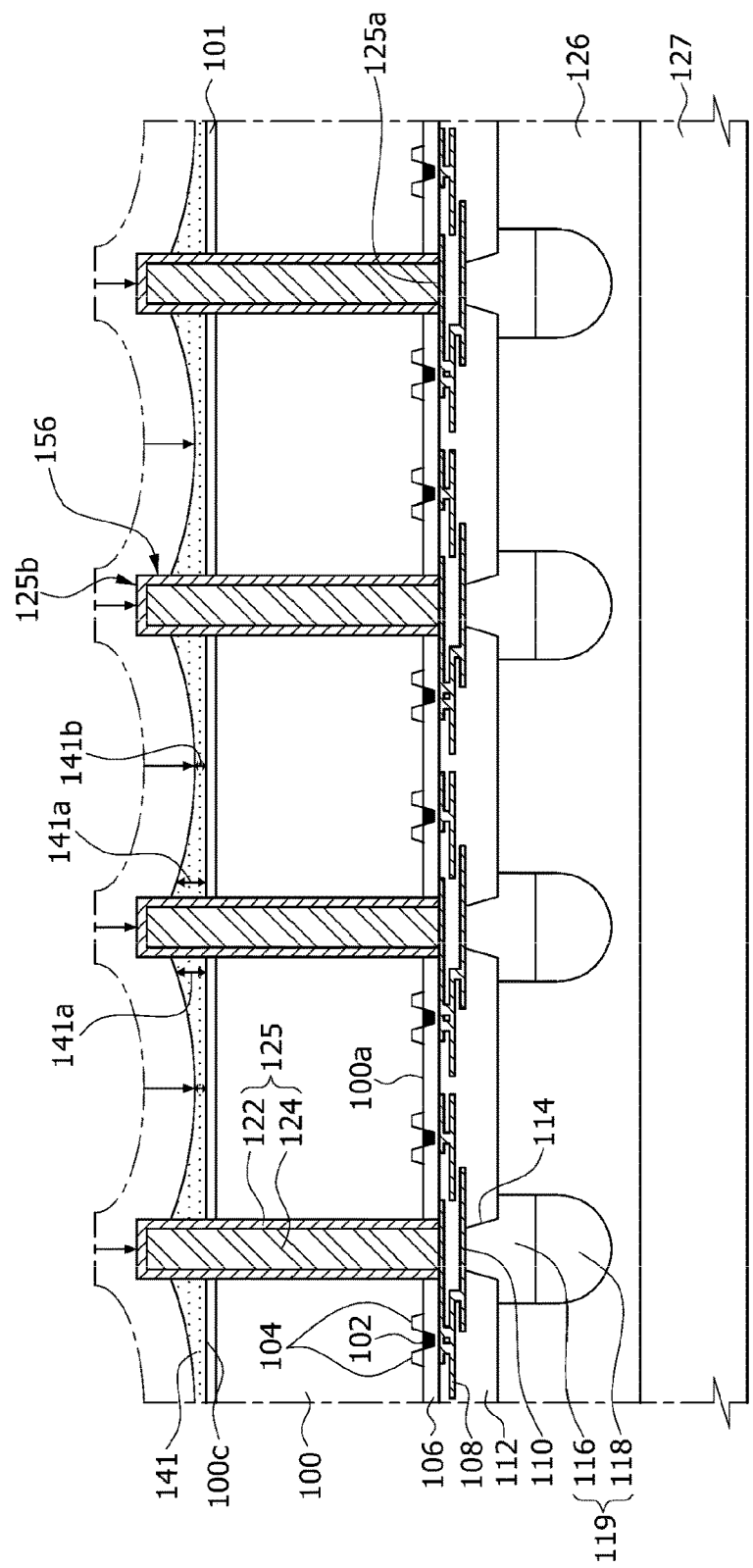

Referring to FIG. 6, the polymer layer 140 of FIG. 5 is etched back to form a polymer pattern 141 that expose the second end surfaces 125b and upper sidewalls 156 of the protrusions of the through electrodes 125. In an embodiment, a developer may be supplied onto the polymer layer 140, and the developer may be rinsed out after a predetermined time elapses. In such a case, a portion of the polymer layer 140 may be dissolved in the developer and then removed with the developer when the developer is rinsed out. As a result, the polymer layer 140 may be etched back to form the polymer pattern 141 exposing the second end surfaces 125b and the upper sidewalls 156 of the protrusions of the through electrodes 125.

As describe above, the polymer layer 140 coated on the second end surfaces 125b of the through electrodes 125 may have the third thickness 140c corresponding to the minimum thickness. Thus, the second end surfaces 125b and the upper sidewalls 156 of the protrusions of the through electrodes 125 are readily exposed when the polymer layer 140 is etched back to form the polymer pattern 141 remaining on the recessed back-side surface 100c of the wafer 100.

In addition, the polymer layer 140 may be uniformly etched back using a developer. Thus, the polymer pattern 141 may include first residual portions 141a that remain in regions adjacent to the sidewalls of the protrusions of the through electrodes 125 and second residual portions 141b that remain in regions between the first residual portions 141a. The second residual portions 141b have a thickness that is smaller than a thickness of the first residual portions 141a. That is, a thickness of the polymer pattern 141 may also be gradually reduced as it becomes far from the sidewalls of the protrusions of the through electrodes 125.

Subsequently, the polymer pattern 141 may be cured by a baking process. The baking process, that is, a curing process, may be performed at a temperature below about 200 degrees Celsius. If the curing process is performed at a temperature over 200 degrees Celsius, characteristics of the semiconductor device may be degraded.

Figure 7:
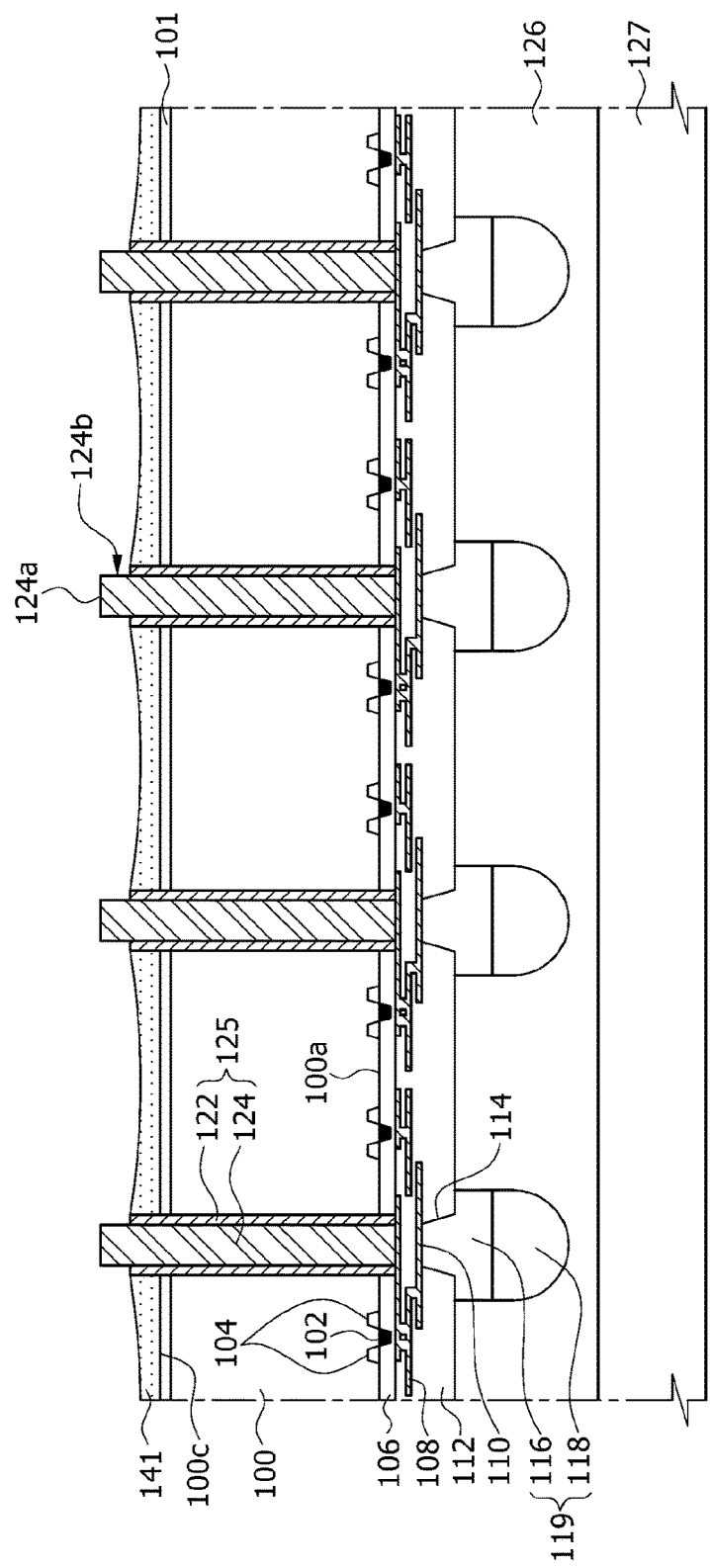

Referring to FIG. 7, an etching process is performed on the exposed portions of the protrusions of the through electrodes 125 to expose end surfaces 124a and upper sidewalls 124b of the through metal electrodes 124. The etching process may be a dry etching process such as a plasma etching process. The etching process may be performed to remove the barrier layer 122 enclosing the end surfaces 124a and the upper sidewalls 124b of the through metal electrodes 124. Accordingly, after the etching process is performed, the end surfaces 124a and the upper sidewalls 124b of the through metal electrodes 124 are exposed. The exposed end surfaces 124a and the exposed upper sidewalls 124b of the through metal electrodes 124 may directly contact back-side bumps to be formed in subsequent processes. Accordingly, contact areas between the through metal electrodes 124 and the back-side bumps may be increased, and thus the reliability of the semiconductor device may be improved.

Figure 8:
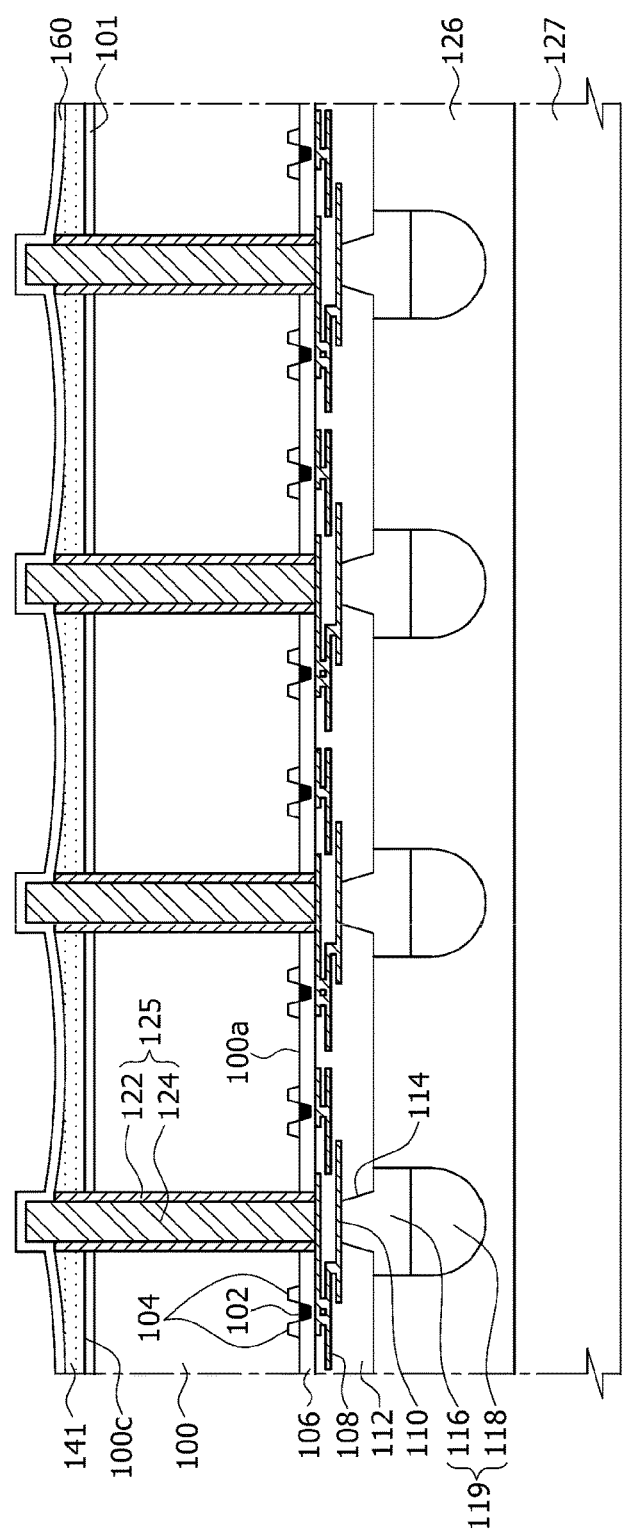

Referring to FIG. 8, a seed metal layer 160 is formed on the polymer pattern 141 and covers the exposed end surfaces 124a and the exposed upper sidewalls 124b of the through metal electrodes 124. Although not shown in the drawings, an adhesive layer may be formed on the polymer pattern 141 before the seed metal layer 160 is formed. The adhesive layer may strengthen the bond between the polymer pattern 141 and the seed metal layer 160 to prevent the seed metal layer 160 from being lifted or detached from the polymer pattern 141 in subsequent processes. The adhesive layer may include at least one selected from the group consisting of a titanium (Ti) material, a tungsten (W) material and a titanium-tungsten (TiW) material.

If the adhesive layer is formed on the polymer pattern 141, the seed metal layer 160 may be formed on the adhesive layer. The seed metal layer 160 may be formed of a copper layer using a chemical vapor deposition (CVD) process or a physical vapor deposition (PVD) process.

Figure 9:
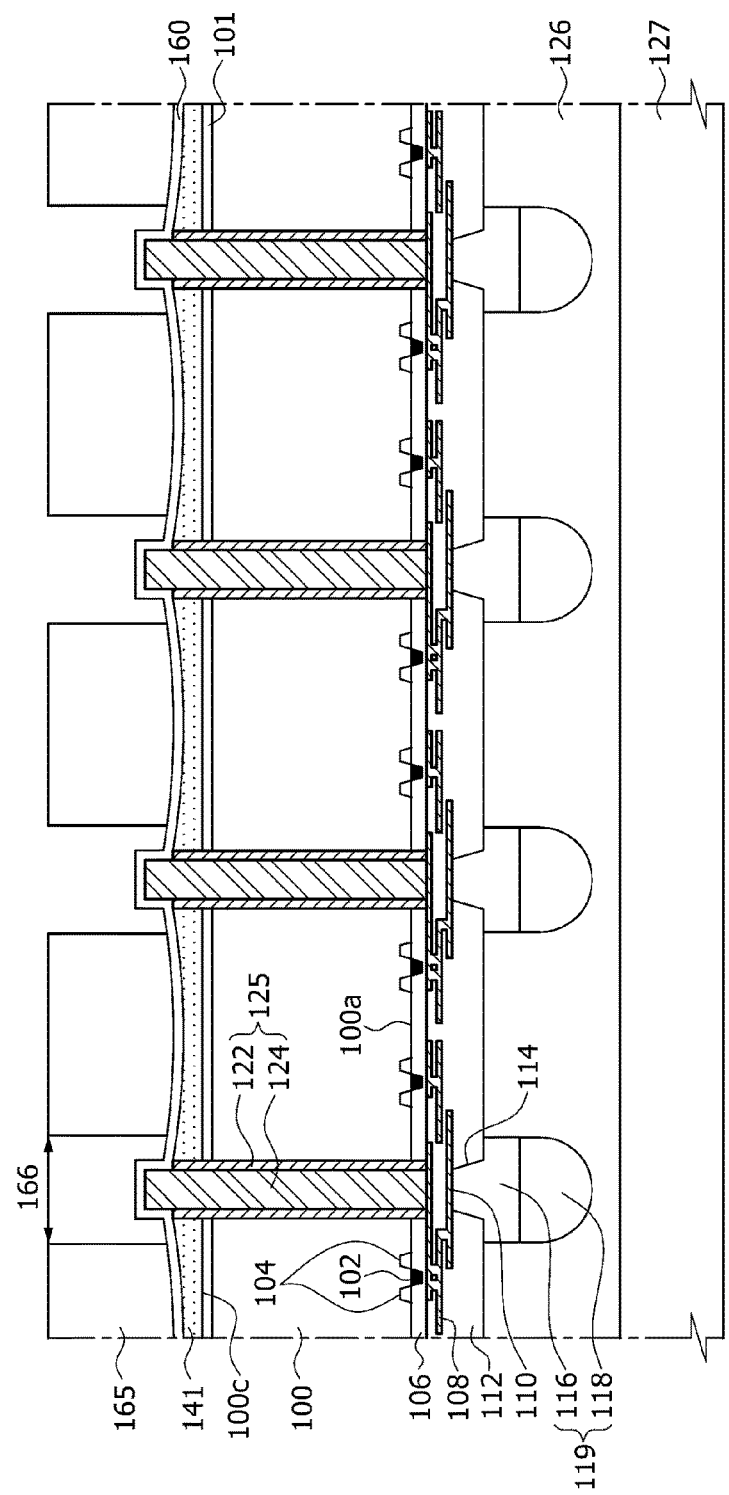

Referring to FIG. 9, a mask pattern 165 having openings 166 is formed on the seed metal layer 160. The openings 166 may define regions in which back-side bumps will be disposed. Specifically, a photoresist layer may be formed on the seed metal layer 160. In an embodiment, a photoresist layer may be patterned using an exposure process and a development process to form the mask pattern 165 having the openings 166. The openings 166 may expose portions of the seed metal layer 160 corresponding to the regions in which the back-side bumps will be disposed. The protrusions of the through electrodes 125 may be disposed in the openings 166.

Figure 10:
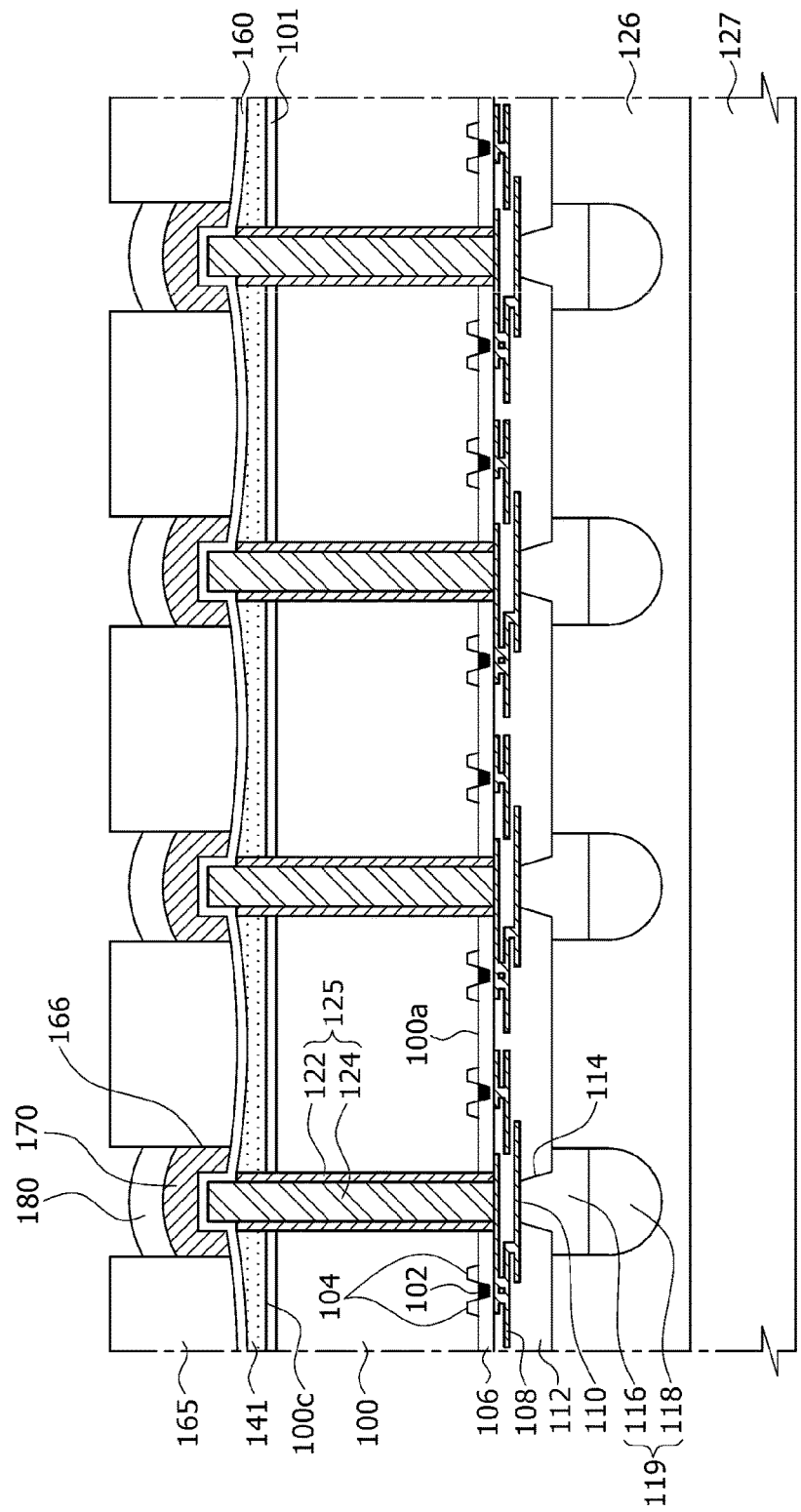

Referring to FIG. 10, a first metal layer 170 and a second metal layer 180 are sequentially formed in each of the openings 166. The first and second metal layers 170 and 180 may be formed using an electroplating process. That is, the first and second metal layers 170 and 180 may be grown on portions of the seed metal layer 160, which are exposed by the openings 166, using the electroplating process.

The first metal layer 170 may include a copper material, and the second metal layer 180 may include a nickel material. Since the first and second metal layers 170 and 180 are formed on the protrusions of the through electrodes 125, each of the first and second metal layers 170 and 180 may have a convex upper surface.

Figure 11A:
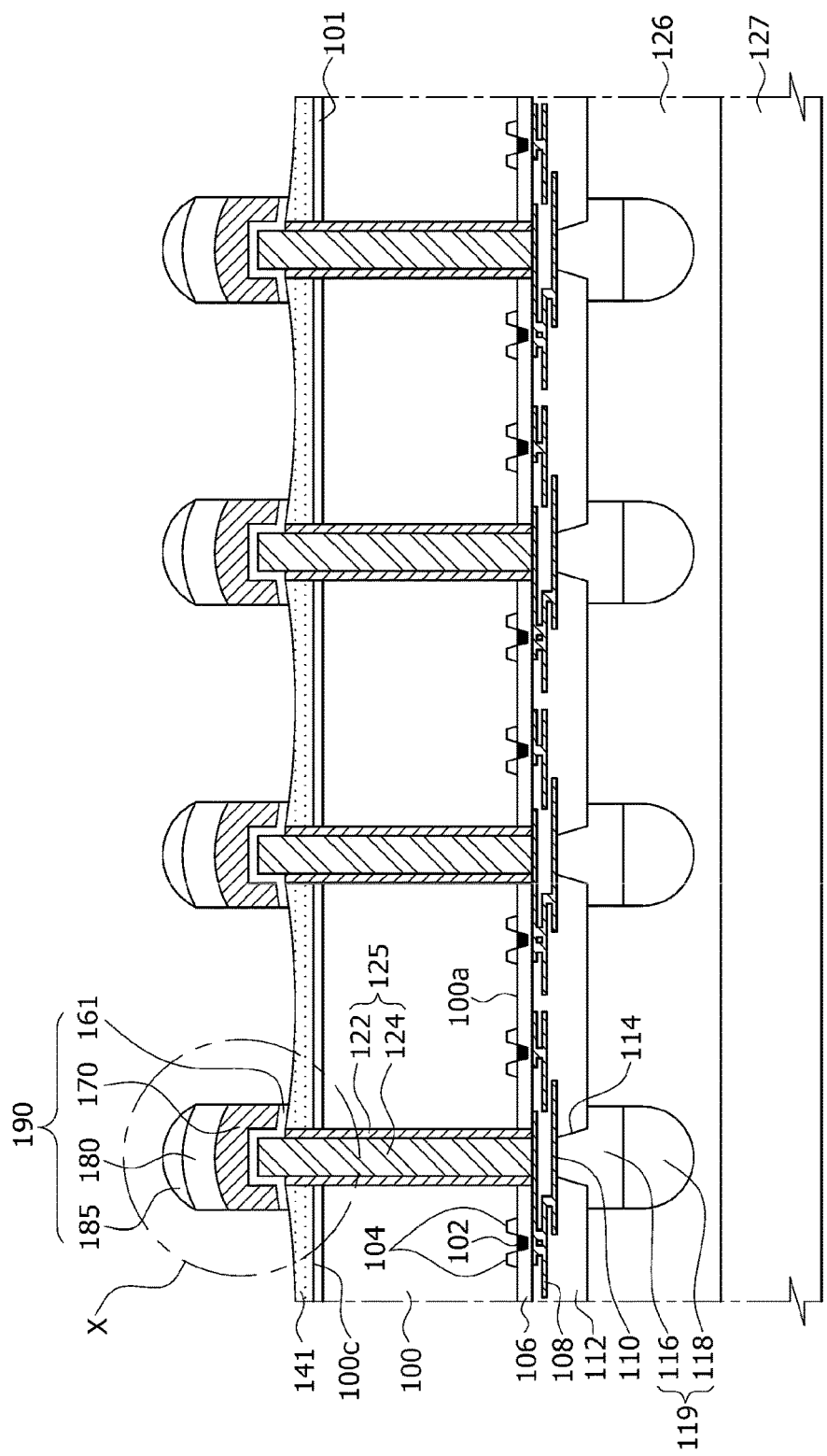
Figure 11B:
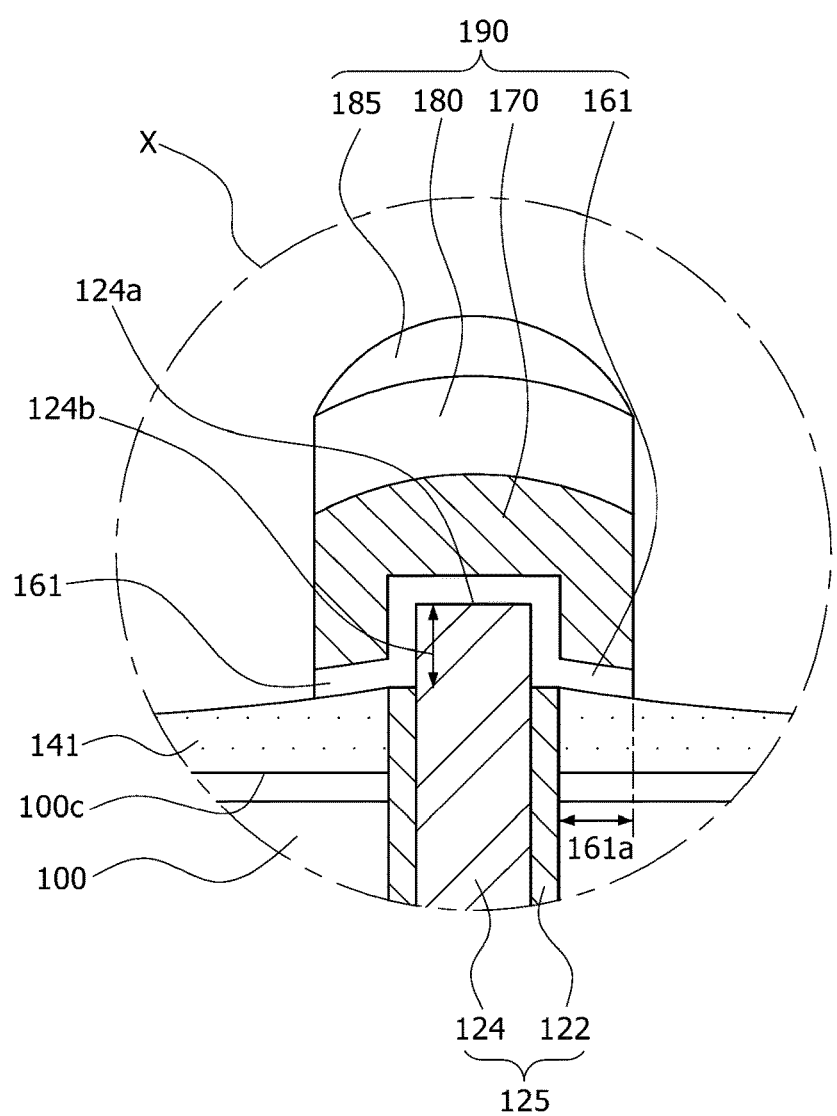

Referring to FIGS. 11A and 11B, the mask pattern 165 is removed using, for example, an ashing process. Subsequently, the portions of the seed metal layer 160 that are exposed after the mask pattern 165 is removed are etched. Portions of the seed metal layer 160 that remain form seed metal patterns 161 disposed under the first metal layers 170. The seed metal layer 160 may be etched using a wet etching process. The seed metal layer 160 may be etched using the first and second metal layers 170 and 180 as etch masks. The seed metal layer 160 may be etched until the polymer pattern 141 is exposed.

An adhesive metal layer 185 may be formed on the second metal layer 180. The adhesive metal layer 185 may include a gold material. The seed metal pattern 161, the first metal layer 170, the second metal layer 180 and the adhesive metal layer 185 stacked on each of the through electrodes 125 constitute a back-side bump 190.

Figure 12:
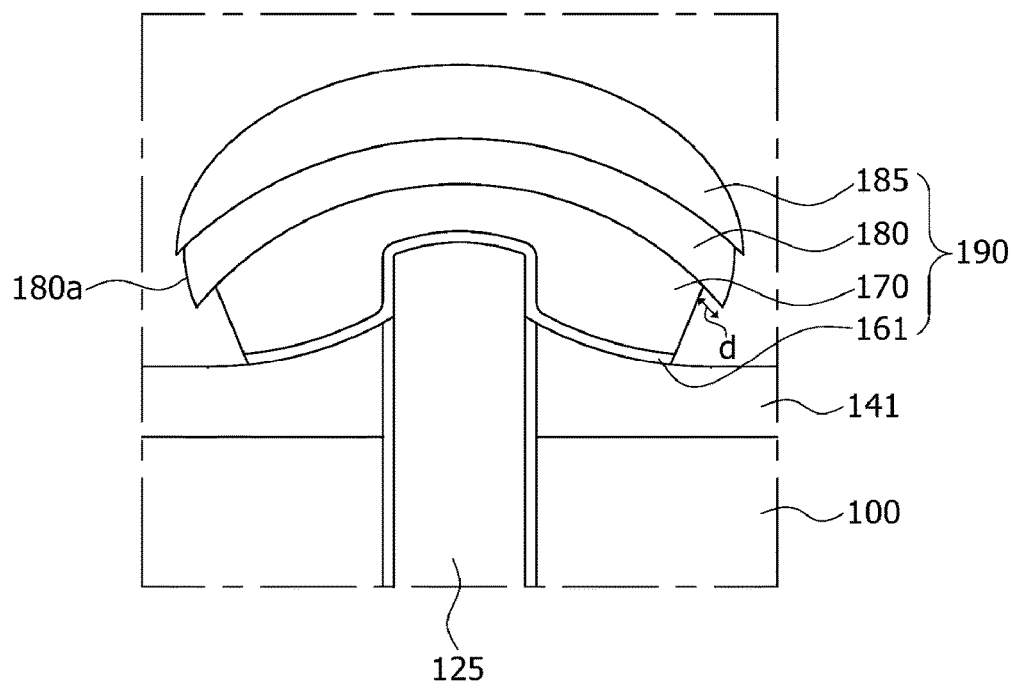
FIG. 12 is a cross-sectional view illustrating a back-side bump included in a semiconductor device according to an embodiment of the present disclosure.

In some embodiments, the first metal layer 170 may be formed of a metal material having substantially the same etch rate as the seed metal pattern 161 when the first metal layer 170 and the seed metal pattern 161 are exposed to a specific etchant. In such a case, the first metal layer 170 may be laterally etched while the seed metal pattern 161 is formed. As a result, undercuts may be formed below edges of the second metal layer 180 as illustrated in FIG. 12. That is, the first metal layer 170 may be laterally recessed from sidewalls 180a of the second metal layer 180 by a first width d.

FIG. 11B illustrates an enlarged view of a portion "X" of FIG. 11A. Referring to FIG. 11B, the back-side bump 190 may be formed to contact the end surface 124a and the upper sidewall 124b of the through metal electrode 124. In addition, the back-side bump 190 may extend onto the polymer pattern 141 by a second width 161a. That is, each of the back-side bumps 190 may be formed to contact the end surface 124a and the upper sidewall 124b of the through metal electrode 124 and a surface of the polymer pattern 141. Thus, a contact area between the back-side bump 190 and the through electrode 125 may increase to improve the strength of the bond between the back-side bump 190 and the through electrode 125.

Referring again to FIGS. 11A and 11B, the polymer pattern 141 may be formed to enclose a lower sidewall of the protrusion of the through electrode 125. Thus, the protrusion of the through electrode 125 may be supported by the polymer pattern 141 to prevent the protrusion of the through electrode 125 from being broken or bent during a fabrication process.

The packages described above may be applied to various electronic systems.

Figure 13:
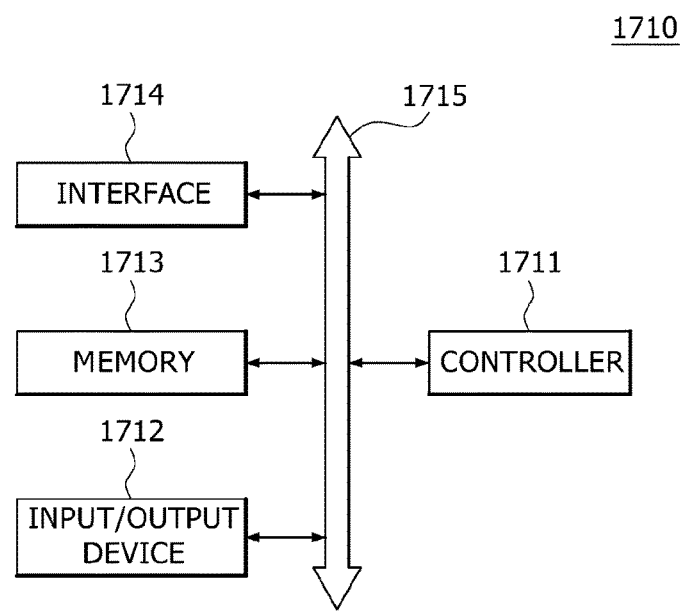
FIG. 13 is a block diagram illustrating an electronic system including a package according to an embodiment.

Referring to FIG. 13, the package in accordance with an embodiment may be applied to an electronic system 1710. The electronic system 1710 may include a controller 1711, an input/output unit 1712, and a memory 1713. The controller 1711, the input/output unit 1712, and the memory 1713 may be coupled with one another through a bus 1715 providing a path through which data are transmitted.

For example, the controller 1711 may include at least any one of at least one microprocessor, at least one digital signal processor, at least one microcontroller, and logic devices capable of performing the same functions as these components. At least one of the controller 1711 and the memory 1713 may include at least any one of the packages according to the embodiments of the present disclosure. The input/output unit 1712 may include at least one selected among a keypad, a keyboard, a display device, a touch screen and so forth. The memory 1713 is a device for storing data.

The memory 1713 may store data and/or commands to be executed by the controller 1711, and the like.

The memory 1713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this case, the electronic system 1710 may stably store a large amount of data in a flash memory system.

The electronic system 1710 may further include an interface 1714 suitable for transmitting and receiving data to and from a communication network. The interface 1714 may be a wired or wireless type. For example, the interface 1714 may include an antenna or a wired or wireless transceiver.

The electronic system 1710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

In an embodiment wherein the electronic system 1710 is an equipment capable of performing wireless communication, the electronic system 1710 may be used in a communication system such as a system employing one or more of CDMA (code division multiple access), GSM (global system for mobile communications), NADC (North American digital cellular), E-TDMA (enhanced-time division multiple access), WCDMA (wideband code division multiple access), CDMA2000, LTE (long term evolution), and Wibro (wireless broadband Internet).

Figure 14:
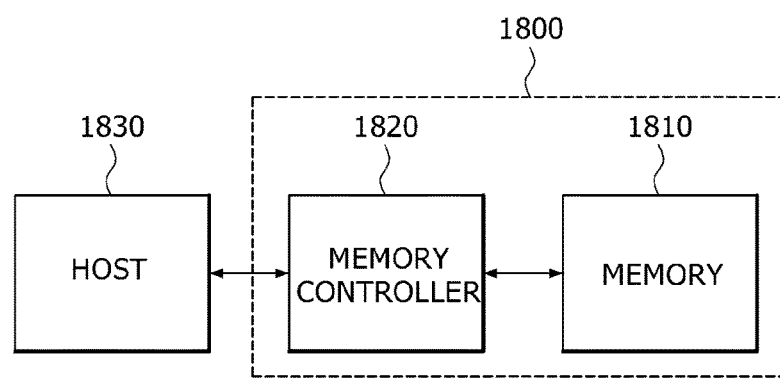
FIG. 14 is a block diagram illustrating another electronic system including a package according to an embodiment.

Referring to FIG. 14, the package in accordance with the embodiments may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least any one among nonvolatile memory devices to which the packaging technologies of the embodiments of the present disclosure are applied. The memory controller 1820 may control the memory 1810 such that stored data is read out or data is stored in response to a read/write request from a host 1830.

Embodiments of the present disclosure have been disclosed for illustrative purposes. Those skilled in the art will appreciate that various modifications, additions and substitutions are possible, without departing from the scope and spirit of the present invention as disclosed in the accompanying claims.

What is claimed is:

1. A semiconductor device comprising:
 a semiconductor layer having a first surface and a second surface that are opposite to each other;
 a through electrode penetrating the semiconductor layer and having a protrusion that protrudes over the second surface of the semiconductor layer;
 a front-side bump disposed over the first surface of the semiconductor layer and electrically coupled to the through electrode;

a polymer pattern disposed over the second surface of the semiconductor layer to enclose a part of the protrusion of the through electrode; and a back-side bump covering an upper surface and a sidewall of a remain part of the protrusion of the through electrode and extending to contact and to cover a portion of the polymer pattern, wherein thicknesses of the polymer pattern between a first position and a second position are gradually reduced at positions that are increasingly further from the sidewall of the protrusion of the through electrode so that the polymer pattern has a declined surface, wherein the through electrode includes a first end surface disposed at the same side of the semiconductor layer as the first surface of the semiconductor layer and a second end surface is disposed at the same side of the semiconductor layer as the second surface of the semiconductor layer, wherein the back-side bump has a semispherical shape and includes:

a seed metal pattern covering the second end surface of the through electrode and a sidewall of a upper portion of the protrusion of the through electrode and extending over the polymer pattern by a predetermined width, the second end surface of the through electrode corresponding to the upper surface of the upper portion; and a first metal layer, a second metal layer and an adhesive metal layer sequentially stacked over the seed metal pattern, and wherein the first metal layer is laterally recessed from a sidewall of the second metal layer so that undercuts are provided below edges an overhanging portion of the second metal layer is disposed at a lower level than a lowermost portion of a top surface of the first metal layer.

2. The semiconductor device of claim 1, further comprising a gettering layer between the semiconductor layer and the polymer pattern.

3. The semiconductor device of claim 1, wherein a surface of the back-side bump opposite to the through electrode has a convex shape.

4. The semiconductor device of claim 1, wherein each of the seed metal pattern, the first metal layer, the second metal layer and the adhesive metal layer has a convex surface.

5. The semiconductor device of claim 1, wherein the back-side bump has a semispherical shape afl€f contacts the declined surface of the polymer pattern.

6. The semiconductor device of claim 1, wherein the first metal layer has a width less than a width of the second metal layer.

7. The semiconductor device of claim 1, wherein the first metal layer has substantially same etch rate as the seed metal pattern.

8. The semiconductor device of claim 7, wherein the first metal layer is formed of a metal different from the second metal layer.

9. The semiconductor device of claim 1, further comprising an insulation layer disposed over the first surface of the semiconductor layer, wherein the insulation layer has an opening in which the front-side bump is disposed.

10. The semiconductor device of claim 9, wherein the front-side bump includes a metal pillar filling the opening of the insulation layer and a solder bump disposed over a surface of the metal pillar opposite to the through electrode.

11. The semiconductor device of claim 1, wherein the polymer pattern includes at least one selected from the group consisting of a benzocyclobutene (BCB) material, a polyimide material and a phenol-type polymer material.

12. A semiconductor device comprising:

a semiconductor layer having a first surface and a second surface that are opposite to each other;

a through electrode penetrating the semiconductor layer and having a protrusion that protrudes over the second surface of the semiconductor layer;

a polymer pattern having a declined surface over the second surface of the semiconductor layer and enclosing a part of the protrusion of the through electrode; and a back-side bump covering an upper surface and a sidewall of a remain part of the protrusion of the through electrode and extending to contact and cover a portion of the declined surface of the polymer pattern, wherein the back-side bump has undercuts and the undercuts are provided below edges of the back-side bump;

wherein the back-side bump has a semispherical shape; and wherein the back-side bump includes a first metal layer and a second metal layer that are sequentially stacked over the polymer pattern and the through electrode, and the first metal layer is laterally recessed from a sidewall of the second metal layer so that an overhanging portion of the second metal layer is disposed at a lower level than a lowermost portion of a top surface of the first metal layer.

13. The semiconductor device of claim 12, wherein the back-side bump further includes:

a seed metal pattern covering the second end surface of the through electrode, and wherein the first metal layer and the second metal layer are sequentially stacked over the seed metal pattern.

14. The semiconductor device of claim 13, wherein the first metal layer has substantially same etch rate as the seed metal pattern.

15. The semiconductor device of claim 13, further comprising a gettering layer between the semiconductor layer and the polymer pattern.

* * * * *